United States Patent
Matsuyama et al.

(10) Patent No.: US 7,709,376 B2
(45) Date of Patent: May 4, 2010

(54) METHOD FOR FABRICATING SEMICONDUCTOR DEVICE AND SEMICONDUCTOR DEVICE

(75) Inventors: Hideto Matsuyama, Kanagawa (JP); Fumio Hoshi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 12 days.

(21) Appl. No.: 12/175,237

(22) Filed: Jul. 17, 2008

(65) Prior Publication Data

US 2009/0026626 A1    Jan. 29, 2009

(30) Foreign Application Priority Data

Jul. 18, 2007    (JP) ............................ 2007-186959

(51) Int. Cl.
 *H01L 23/48* (2006.01)
(52) U.S. Cl. ................ 438/648; 438/685; 257/E21.168
(58) Field of Classification Search ................ 257/770, 257/774, 674, E21.168; 438/685
See application file for complete search history.

(56) References Cited

U.S. PATENT DOCUMENTS

| 6,093,645 | A | 7/2000 | Ameen et al. |
| 6,159,852 | A | 12/2000 | Nuttall et al. |
| 6,284,653 | B1 * | 9/2001 | Tseng ........................ 438/653 |
| 2007/0099421 | A1 | 5/2007 | Kim et al. |

FOREIGN PATENT DOCUMENTS

| JP | 07-22347 | 1/1995 |
| JP | 07-86209 | 3/1995 |
| JP | 2001-523043 | 11/2001 |

* cited by examiner

*Primary Examiner*—Roy K Potter
(74) *Attorney, Agent, or Firm*—Finnegan, Henderson, Farabow, Garrett & Dunner, L.L.P.

(57) ABSTRACT

A method for fabricating a semiconductor device includes forming a dielectric film on a semiconductor substrate; forming an opening in the dielectric film; forming a refractory metal film in the opening; performing a nitriding process to the refractory metal film; removing a nitride of the refractory metal film formed on a side wall of the opening; and depositing tungsten (W) in the opening from which the nitride is removed.

13 Claims, 5 Drawing Sheets

METHOD FOR FABRICATING SEMICONDUCTOR DEVICE AND SEMICONDUCTOR DEVICE

CROSS-REFERENCE TO RELATED APPLICATION

This application is based upon and claims the benefit of priority from prior Japanese Patent Application No. 2007-186959 filed on Jul. 18, 2007 in Japan, the entire contents of which are incorporated herein by reference.

BACKGROUND OF THE INVENTION

1. Field of the Invention

The present invention relates to a method for fabricating a semiconductor device and a semiconductor device, for example, a semiconductor device in which a contact plug to connect a device portion to a wire such as a copper (Cu) wire is arranged and a method for fabricating a semiconductor device.

2. Related Art

In recent years, a new micropatterning technique is developed with advancing of the integration density and performance of a semiconductor integrated circuit (LSI). In particular, recently, in order to achieve the advancing of the high-speed performance of an LSI, an action that replaces a wire material from a conventional aluminum (Al) alloy into low-resistance copper (Cu) or a Cu alloy (to be collectively referred to as Cu hereinafter) is gaining. With recent micropatterning of the semiconductor integrated circuit described above, a contact hole to connect a Cu wire to a substrate diffusion layer and a contact hole to connect a Cu wire to a source, a drain and a gate electrode of a transistor decrease in diameter. Accordingly, aspect ratios of the contact holes increase. For this reason, an increase in contact resistance in a contact plug becomes serious.

For example, a conventional contact plug is formed as follows. Titanium (Ti) is deposited on a substrate surface, a contact hole wall surface, and a contact hole bottom surface. Titanium silicide ($TiSi_2$) is formed on a silicon (Si) substrate on the bottom surface. On the other hand, Ti on the contact hole wall surface is nitrided to form titanium nitride (TiN). Thereafter, the contact hole is buried with a tungsten (W) film to form a contact plug (for example, see Published Japanese Translation No. 2001-523043 of the PCT International Publication).

In this case, when the W film serving as a plug is formed, a chemical vapor deposition (CVD) method which supplies a tungsten hexafluoride ($WF_6$) gas, hydrogen ($H_2$) serving as a reducing gas, and the like is used. At this time, if a barrier metal layer is not formed, fluorine (F) of $WF_6$ performs F-attack the contact hole bottom surface during film formation of the W film to damage a contact interface and to influence the characteristics of the device. For this reason, as described above, the barrier metal layer is formed in advance to prevent the F attack. Furthermore, from this viewpoint, by a thermal CVD method using an organic Ti material, a thermal CVD method using titanium tetrachloride ($TiCl_4$) serving as an inorganic material, and the like, formation of a TiN film on a Ti film or further growth of a TiN film after the Ti film is nitrided are also attempted.

On the other hand, with advancing of the integration density of a recent semiconductor integrated circuit, a contact hole decreases in diameter. Although the contact hole decreases in diameter, when a TiN film serving as a barrier metal is formed to have the same thickness as that used when a contact hole has a large diameter, a volume of a W film for a contact plug reduces. For this reason, a ratio of the volume of the high-resistance TiN film to the volume of the W film increases, and a contact resistance disadvantageously increases accordingly.

BRIEF SUMMARY OF THE INVENTION

A method for fabricating a semiconductor device in an aspect of the invention, includes forming a dielectric film on a semiconductor substrate; forming an opening in the dielectric film; forming a refractory metal film in the opening; performing a nitriding process to the refractory metal film; removing a nitride of the refractory metal film formed on a side wall of the opening; and depositing tungsten (W) in the opening from which the nitride is removed.

A semiconductor device in another aspect of the invention, includes a dielectric film formed on a semiconductor substrate; a refractory metal nitride film obtained by forming a refractory metal film in an opening formed in the dielectric film, performing a nitriding process to the refractory metal film to obtain a nitride of the refractory metal film, and then removing the nitride of the refractory metal film on a side wall of the opening to leave the nitride of the refractory metal film on a bottom surface of the opening; and a tungsten (W) plug which has a side surface being in contact with the dielectric film and which is formed on the refractory metal nitride film.

DETAILED DESCRIPTION OF THE INVENTION

In the following embodiments, a method for fabricating a semiconductor device having a contact plug the resistance of which is made lower than that in a conventional semiconductor device and the semiconductor device will be described below.

Embodiment 1

Figure 1:
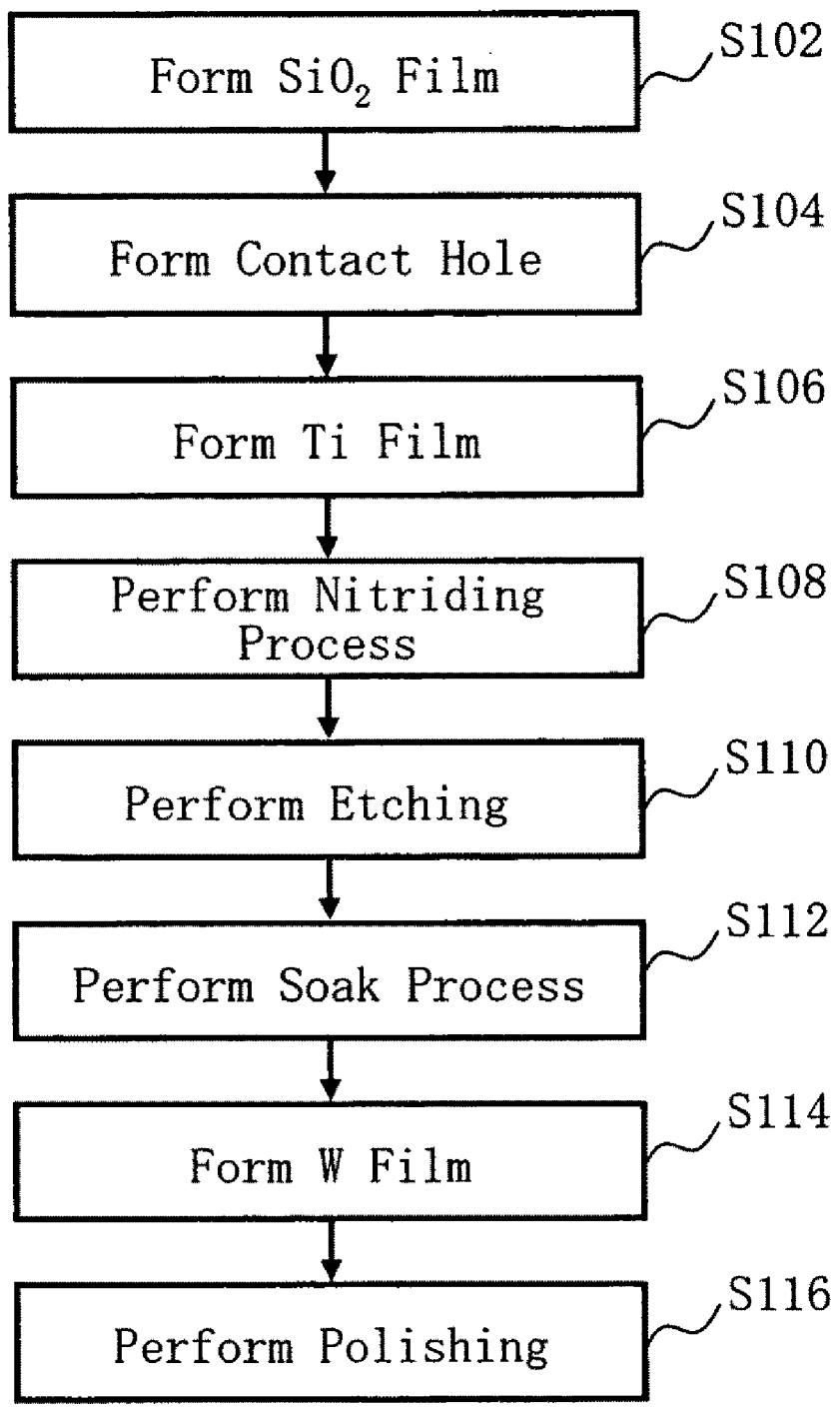
FIG. 1 is a flow chart showing a main part of a method for fabricating a semiconductor device according to Embodiment 1.

Embodiment 1 will be described below with reference to the accompanying drawings. FIG. 1 is a flow chart showing a main part of a method for fabricating a semiconductor device according to Embodiment 1. In FIG. 1, in the method for fabricating a semiconductor device according to Embodiment 1, a series of steps, that is, an $SiO_2$ film forming step (S102), a contact hole forming step (S104), a Ti film forming step (S106), a nitriding process step (S108), an etching step (S110), a soak process step (S112), a W film forming step (S114), and a polishing step (S116) are executed.

FIGS. 2A to 2D are sectional diagrams showing steps executed in accordance with the flow chart in FIG. 1. FIGS. 2A to 2D show the $SiO_2$ film forming step (S102) to the nitriding process step (S108) in FIG. 1.

Figure 2A:
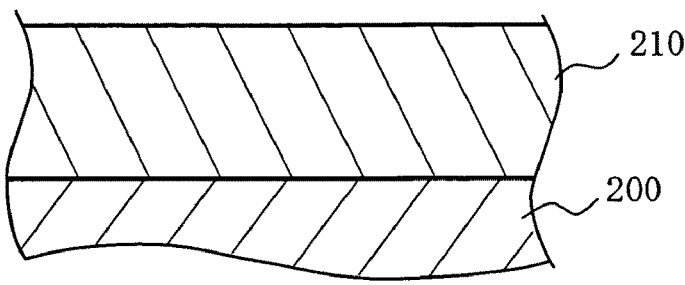
FIGS. 2A to 2D are sectional diagrams showing steps executed in accordance with the flow chart in FIG. 1.

In FIG. 2A, as the $SiO_2$ film forming step (S102) serving as the dielectric film forming step, by a CVD (chemical vapor deposition) method, on a surface of a substrate 200 on which device portions such as a substrate diffusion layer and a gate electrode are formed, for example, a thin $SiO_2$ film having a film thickness of 300 nm is deposited to form an $SiO_2$ film 210 serving as a dielectric film. In this case, although the film is formed by the CVD method, another method may be used. As the substrate 200, for example, a silicon wafer having a diameter of 300 mm is used. In this case, the device portions are omitted in the drawings.

Figure 2B:
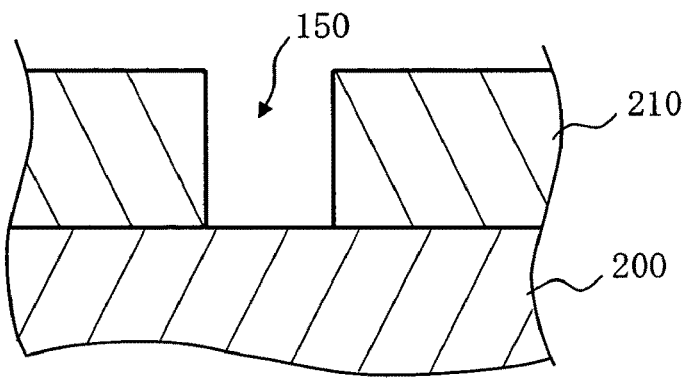

In FIG. 2B, as the contact hole forming step (S104) serving as an opening forming step, an opening 150 serving as a contact hole structure to be connected to the device portions is formed in the $SiO_2$ film 210 in a lithography step and a dry etching step. From the substrate 200 in which a resist film is formed on the $SiO_2$ film 210 through a resist coating step (not shown) and a lithography step such as an exposing step, the exposed $SiO_2$ film 210 is removed by an anisotropic etching method to almost vertically form the opening 150 in the surface of the substrate 200. For example, as an example, the opening 150 may be formed by a reactive ion etching method.

Figure 2C:
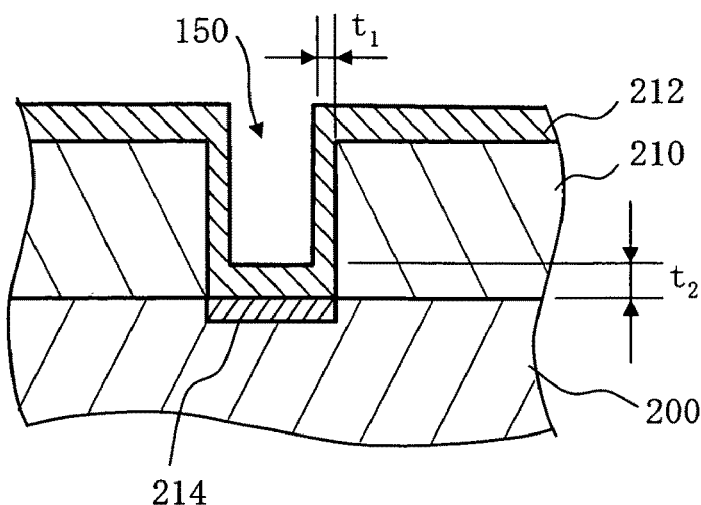

In FIG. 2C, as the Ti film forming step (S106) serving as a refractory metal film forming step, a Ti film 212 using Ti serving as a refractory metal is formed on an inner wall (side wall and bottom surface) of the opening 150 formed by the opening forming step and a surface of the $SiO_2$ film 210. The Ti film 212 is preferably formed by a film forming method (deposition method) having directivity. In this case, the Ti film 212 is formed by using a plasma CVD method. A gas mixture of titanium tetrachloride ($TiCl_4$), hydrogen ($H_2$), and argon (Ar) is caused to flow, a predetermined chamber internal pressure and a substrate temperature are set, a plasma is generated at a counter electrode of the substrate. In this manner, $TiCl_4$ is subjected to a reducing process with $H_2$ to make it possible to form the Ti film 212. When the film forming method has directivity, a film thickness ($t_1$) of the Ti film 212 formed on the side wall of the opening 150 can be made thinner than a film thickness ($t_2$) of the Ti film 212 formed on the surface of the $SiO_2$ film 210 and the bottom surface of the opening 150. For example, the Ti film 212 formed on the surface of the $SiO_2$ film 210 and the bottom surface of the opening 150 is formed to have a thickness of 4 nm, and the Ti film 212 formed on the side wall of the opening 150 is formed to have a thickness of 2 nm. The forming method is not limited to the plasma CVD method, and a sputter method which is one of physical vapor deposition (PVD) methods may be used. On the Ti film 212 serving as a adhesion layer formed on the bottom portion of the opening 150, the oxide film on the substrate 200 formed on the bottom portion of the opening 150 is reduced and removed by Ti to form a titanium silicide ($TiSi_2$) film 214. In this manner, of the Ti film 212 formed on the bottom portion of the opening 150, a portion on the semiconductor substrate 200 side is transformed (changed) while leaving the Ti film 212 on the surface portion. The $TiSi_2$ film 214 is formed to make it possible to secure an ohmic contact.

Figure 2D:
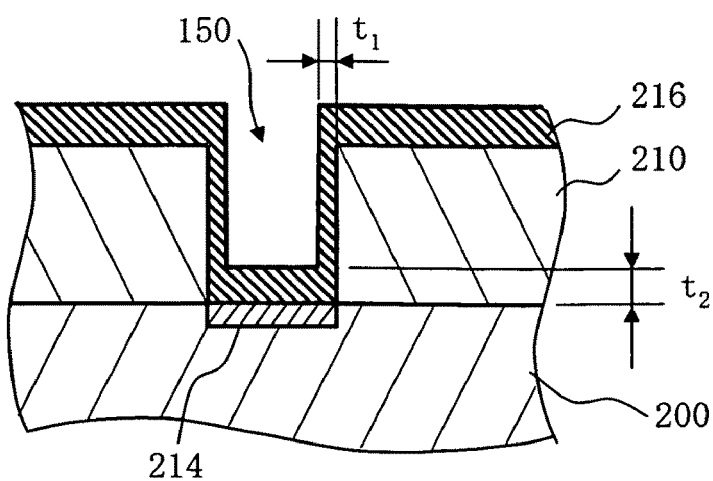

In FIG. 2D, as the nitriding process step (S108), the Ti film 212 is nitrided to transform the Ti film 212 into a titanium nitride (TiN) film 216 which is a nitride of the Ti film 212. In this case, of the Ti film 212, the Ti film 212 portion which is not changed into the $TiSi_2$ film 214 is nitrided to form the TiN film 216. When the Ti film 212 is formed by using $TiCl_4$, the Ti film 212 containing large quantities of chlorine (Cl) is formed on the inner wall (side wall and bottom surface) of the opening 150 and the surface of the $SiO_2$ film 210. For this reason, the $TiSi_2$ film 214 contains large quantities of Cl. In this state, the contact increases in resistance to deteriorate adhesion. Therefore, an ammonia ($NH_3$) gas or a nitrogen ($N_2$) gas is caused to flow on the Ti film 212 to generate a plasma. The Ti film 212 can be transferred into the TiN film 216, and chlorine (Cl) can be removed from the Ti film 212 and the $TiSi_2$ film 214.

FIGS. 3A to 3D are sectional diagrams showing steps executed in accordance with the flow chart in FIG. 1. FIGS. 3A to 3D show the etching step (S110) to the polishing step (S116) in FIG. 1.

Figure 3A:
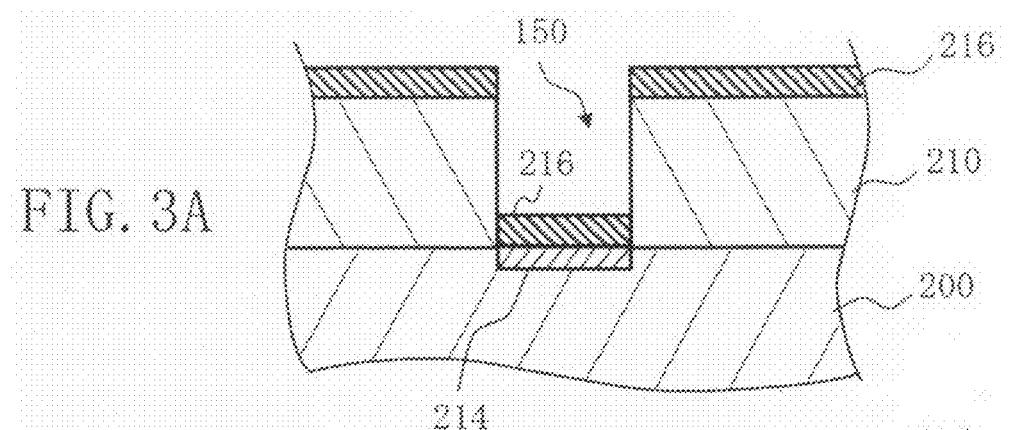
FIGS. 3A to 3D are sectional diagrams showing steps executed in accordance with the flow chart in FIG. 1.

In FIG. 3A, as the etching step (S110) serving as one example of a removing step, the TiN film 216 formed on the side wall of the opening 150 is removed by etching. In this case, in particular, the TiN film 216 on the side wall of the opening 150 is removed by an isotropic wet etching process.

Figure 4:
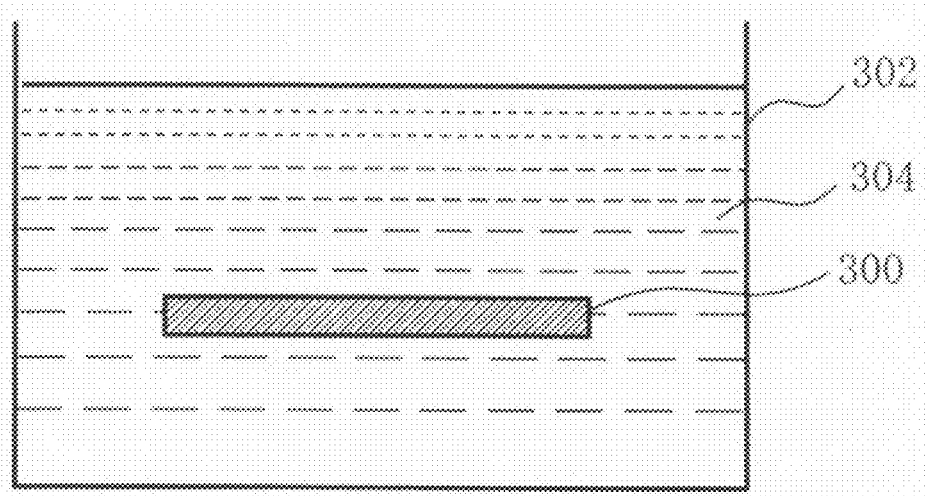
FIG. 4 is a conceptual diagram for explaining an example of a way of a wet etching process in Embodiment 1.

FIG. 4 is a conceptual diagram for explaining one example of a way of the wet etching process in Embodiment 1. In this case, as shown in FIG. 4, a substrate 300 in a state shown in FIG. 2D is dipped in an etching bath 302 filled with an etching solution 304 to perform wet etching. As the etching solution 304, a mixture of hydrogen peroxide ($H_2O_2$) and a sulfuric acid ($H_2SO_4$) is preferably used. As a dipping time, for example, 30 s to 60 s are preferably set. Since the TiN film 216 formed on the side wall of the opening 150 has a smaller thickness than that of the TiN film 216 formed on the bottom surface of the opening 150, the TiN film 216 formed on the side wall of the opening 150 is removed by an isotropic wet etching process in advance. For this reason, the TiN film 216 formed on the side wall of the opening 150 can be removed to thinly leave the TiN film 216 on the bottom surface of the opening 150.

The way of the wet etching process is not limited to the way in which the substrate 300 is dipped in the etching solution 304 in the etching bath 302 as shown in FIG. 4.

Figure 5:
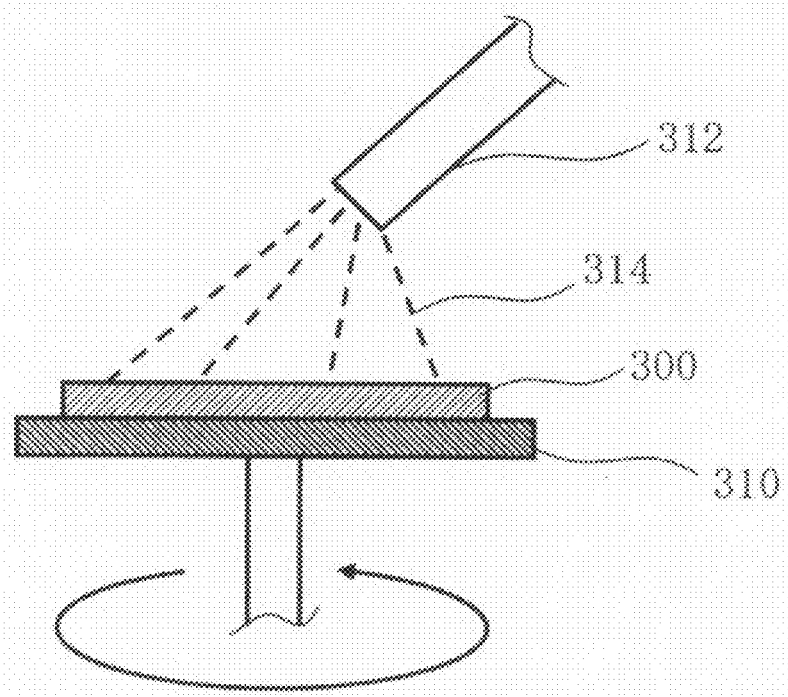
FIG. 5 is a conceptual diagram for explaining another example of the way of the wet etching process in Embodiment 1.

FIG. 5 is a conceptual diagram for explaining another example of the way of the wet etching process in Embodiment 1. In this case, the following configuration is preferably applied. That is, as shown in FIG. 5, the substrate 300 is placed on a rotating table 310, an etching solution 314 is sprayed (supplied) from an exhaust nozzle 312 toward the substrate 300 like a shower while rotating the substrate 300.

Although W serving as a contact plug material is consequently deposited on the opening 150, as described above, since the TiN film 216 is entirely removed from the side wall of the opening 150, a metal film serving as an underlayer is not present. In this state, the adhesion of the W film is poor. For this reason, growing rates of the W films on the side wall of the opening 150 and on the bottom surface are different from each other, and the W film is not easily deposited in the opening 150 without any gap. Therefore, the surface states of the surface of the $SiO_2$ film 210 exposed to the side wall of the opening 150 and the surface of the TiN film 216 on the bottom surface are preferably matched with each other.

Figure 3B:
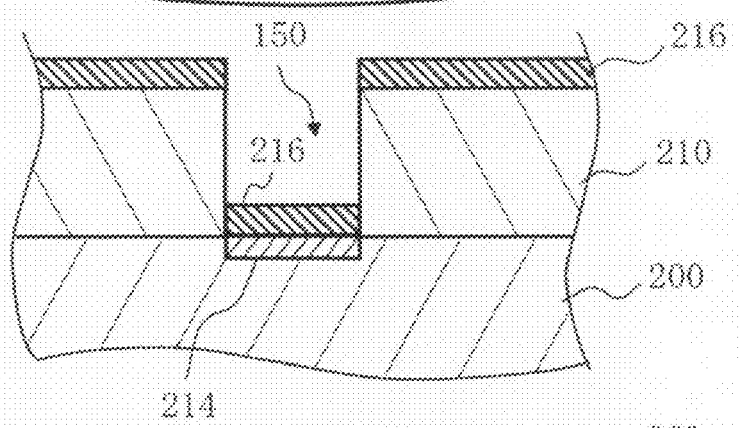

In FIG. 3B, as the soak process step (S112), the substrate surface and the inner wall (side wall and bottom surface) in the opening 150 are exposed to a reducing gas atmosphere. In this case, a reducing gas such as a silane ($SiH_4$) gas or a diborane ($B_2H_6$) gas is supplied to expose the substrate surface and the inner wall (side wall and bottom surface) of the opening 150 to the reducing gas atmosphere 218 to sufficiently adsorb a reducing material to the surface of the $SiO_2$ film 210 exposed to the side wall of the opening 150 and the surface of the TiN film 216 left on the bottom surface. The soak process may be performed in a film forming apparatus used in the next W film forming step (S114).

Figure 3C:
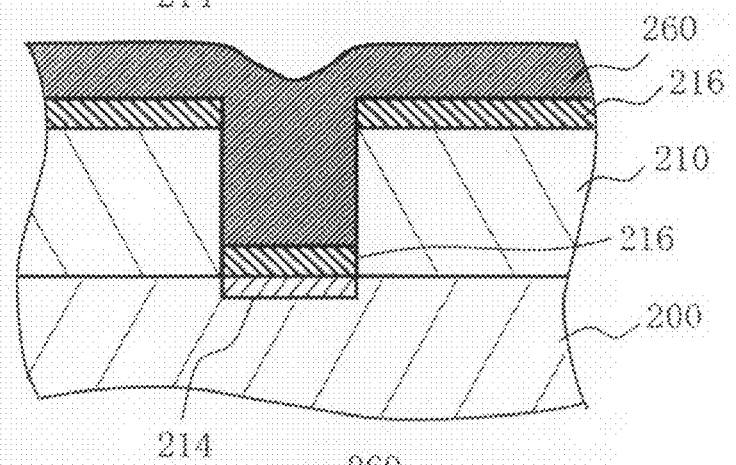

In FIG. 3C, as the W film forming step (S114) serving as a depositing step, a W film 260 serving as a contact plug material is deposited (formed) in the opening 150 and the surface of the substrate 200 by a CVD method to entirely bury the opening 150. The deposition of the W film 260 is performed by an initial film forming step and a hole burying step. As process gases used in both the steps, $SiH_4$, $WF_6$, Ar, and $H_2$ are used. As a carrier gas, $N_2$ is used. As the initial film forming step, after a substrate is heated to, for example, 390° C., and a $WF_6$ gas and a gas mixture of $SiH_4$ and $H_2$ are alternately supplied to deposit the W films 260 on the side wall of the opening 150 and the bottom surface of the opening 150 to have approximately equal thicknesses. At this time, a pressure is set to, for example, $1 \times 10^4$ Pa. For example, $WF_6$, $SiH_4$, Ar, $H_2$, and $N_2$ are supplied at gas flow rates of 0.50 Pa·m³/s (300 sccm), 1.01 Pa·m³/s (600 sccm), 10.1 Pa·m³/s (6000 sccm), 6.72 Pa·m³/s (4000 sccm), and 3.34 Pa·m³/s (2000 sccm), respectively. A processing time is set to, for example, 28 s. After a W initial film having a thickness of, for example, 5 nm is uniformly formed on the inner surface of the opening 150, in the initial film forming step, a gas mixture of $WF_6$, Ar, and $H_2$ is continuously supplied as the hole burying step to entirely bury the opening 150.

When the W film 260 is formed, as described above, the state of the surface of the $SiO_2$ film 210 exposed to the side wall of the opening 150 and the state of the surface of the TiN film 216 on the bottom surface are matched with each other by the soak process step (S112). For this reason, W can be prevented from being abnormally locally grown. As a result, the filling property of the W film in the opening 150 can be improved. Since the TiN film 216 is left on the lower side of the W film 260, F-attack can be suppressed from being performed to the $TiSi_2$ film 214. In this case, in Embodiment 1, although the TiN film 216 is used, F-attack can be suppressed more greatly than that suppressed when, for example, a TiN silicide (TiSiN) film is replaced with the TiN film 216. TiN does not react with F easier than TiSiN. This is because TiN has compound stability higher than that of TiSiN. For this reason, the TiN film 216 has a barrier property to F higher than that of the TiSiN film. Therefore, by using the TiN film 216, F-attack can be suppressed greatly more than that suppressed by using the TiSiN film.

Although the gas mixture of $SiH_4$ and $H_2$ is used as a reducing gas for $WF_6$, the reducing gas is not limited to the gas mixture. On the W film 260, any one of an $SiH_4$ gas, a diborane ($B_2H_6$) gas, and an $H_2$ gas and a $WF_6$ gas may be supplied, and $WF_6$ may be reduced by any one of $SiH_4$, $B_2H_6$, and $H_2$. Alternatively, the gas mixture of the $SiH_4$ gas, the $B_2H_6$ gas, and the $H_2$ gas and the $WF_6$ gas may be supplied, and $WF_6$ may be reduced by the gas mixture.

Figure 3D:
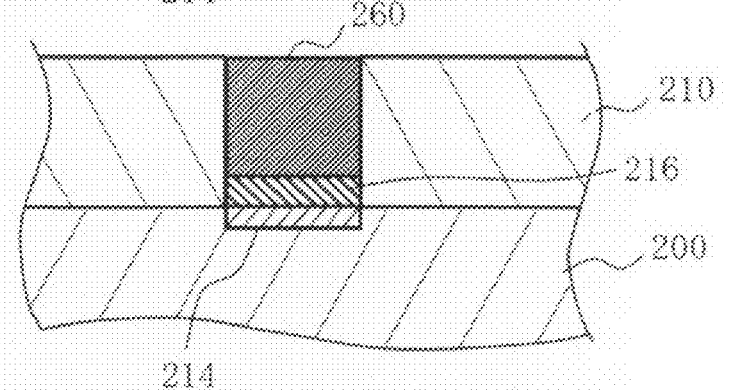

In FIG. 3D, as the polishing step (S116), by a CMP method, the surface of the substrate 200 is polished to remove the W film 260 and the TiN film 216 deposited on a surface except for the opening by polishing. As a result, planarization can be performed as shown in FIG. 3D. As described above, in the semiconductor device according to Embodiment 1, the TiN film 216 serving as a refractory metal nitride film is formed on the substrate 200, and the W film 260 serving as a contact plug is formed on the TiN film 216. On a side surface side of the contact plug, the $SiO_2$ film 210 serving as a dielectric film is arranged to be in contact with the W film 260. In this manner, since no barrier metal film is formed on the side surface of the contact plug, a plug resistance can be reduced accordingly. Therefore, when the contact hole decreases in diameter, a ratio of the volume of the W film 260 having a low resistance to the entire volume is larger than that in a conventional technique. For this reason, the contact resistance can be reduced.

Embodiment 2

In Embodiment 1, although the TiN film 216 on the sidewall of the opening 150 is removed by wet etching, the removing method is not limited to this way. In Embodiment 2, a case in which the TiN film 216 on the side wall of the opening 150 is removed by another method will be described below.

Figure 6:
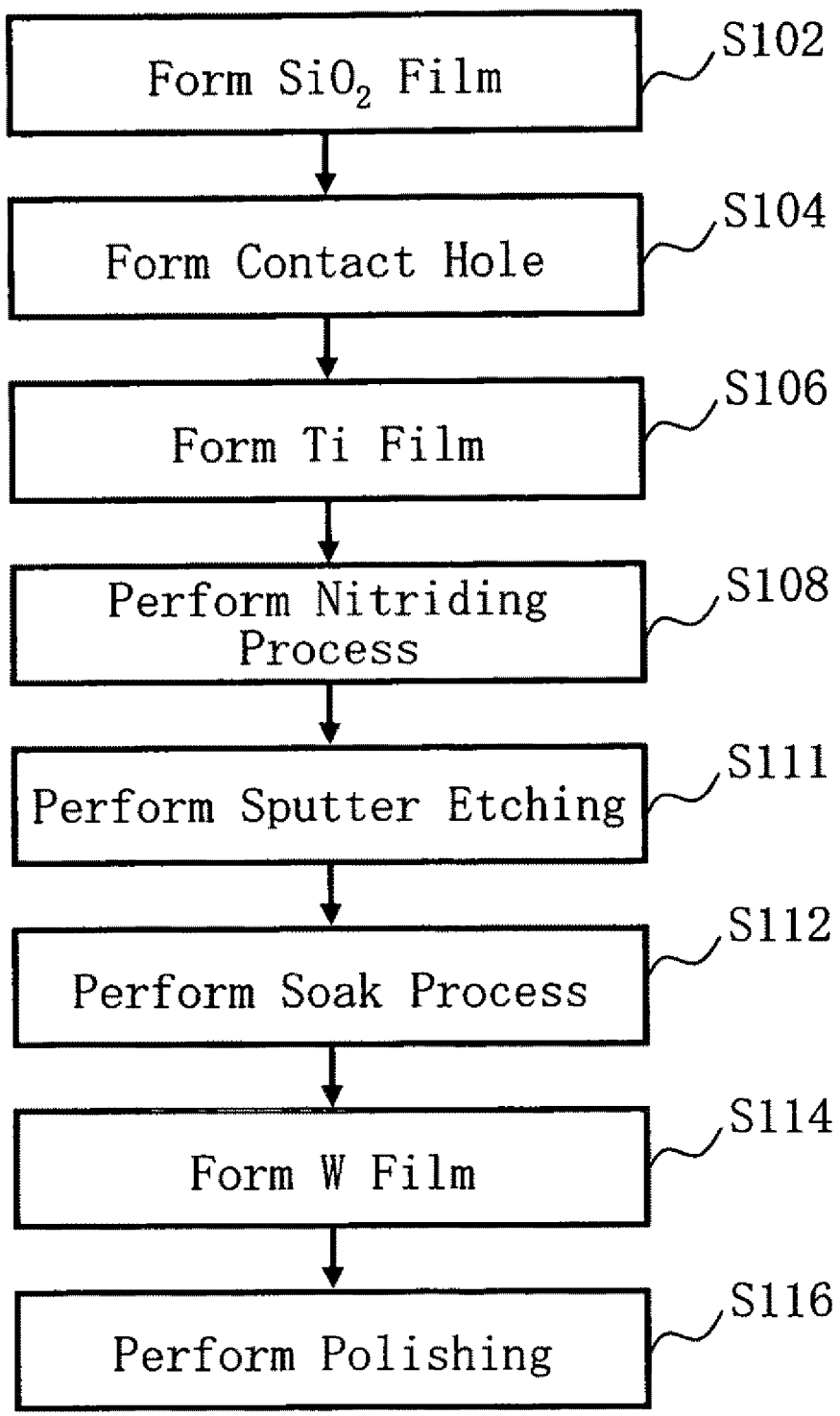
FIG. 6 is a flow chart showing a main part of a method for fabricating a semiconductor device according to Embodiment 2.

FIG. 6 is a flow chart showing a main part of a method for fabricating a semiconductor device according to Embodiment 2. In FIG. 6, the method for fabricating a semiconductor device according to Embodiment 2 is the same as that in FIG. 1 except that a sputter etching step (S111) is used in place of the wet etching step (S110). Therefore, the contents of the steps from the $SiO_2$ film forming step (S102) to the nitriding process step (S108) are the same as those in Embodiment 1.

As the sputter etching step (S111) serving as another example of the removing process, the TiN film 216 formed on the side wall of the opening 150 is removed by sputter etching in the state shown in FIG. 2D. For example, RF 4 kW and DC 5 kW are preferably set as sputter electric powers, and Ar is preferably used as a gas. In this manner, the TiN film 216 may be removed by the sputter etching method. The contents of the subsequent steps from the soak process step (S112) to the polishing step (S116) are the same as those in Embodiment 1.

As described above, when a barrier metal film on the side surface of the contact plug is eliminated, the resistance of the contact plug can be made lower than that in a conventional technique.

Embodiment 3

In Embodiments 1 and 2, although the W films 260 are deposited on the side wall of the opening 150 and the bottom surface of the opening 150 to have approximately equal thicknesses when the W film 260 is formed. The invention is not limited to this configuration. In Embodiment 3, a case in which the W film 260 is selectively deposited on the TiN film 216 on the bottom surface of the opening will be described below. A flow chart showing a main part of a method for fabricating a semiconductor device according to Embodiment 3 is the same as that in FIG. 1 or 6 except for the contents of the W film forming step (S114). Therefore, the contents of the steps from the $SiO_2$ film forming step (S102) to the soak process step (S112) and the contents of the polishing step (S116) are the same as those in Embodiment 1.

In FIG. 3C, as the W film forming step (S114), by the selective CVD method, the W film 260 serving as a contact plug material is selectively deposited on the TiN film 216 in the opening 150 to entirely bury the opening 150. The deposition of the W film 260 is performed by a so-called W selective CVD method. $WF_6$ and $SiH_4$ are used as a process gas. The process is performed by a gas mixture obtained by adding a pressure adjusting gas and Ar and $N_2$ serving as a carrier gas to the process gas. As film forming conditions, after the substrate is heated and kept at, for example, 300° C., a gas mixture of $WF_6$, $SiH_4$, Ar, and $N_2$ is supplied. In this manner, the W film 260 is selectively grown on only the TiN film 216 in the opening 150, and W is grown upwardly from the lower side in the opening 150 to entirely fill the inside of the opening 150 with W. At this time, a pressure is set to, for example, 1.0 Pa, and $WF_6$, $SiH_4$, Ar, and $N_2$ are supplied at gas flow rates of 0.17 Pa·m³/s (100 sccm), 0.08 Pa·m³/s (50 sccm), 2.01 Pa·m³/s (1200 sccm), and 0.50 Pa·m³/s (300 sccm), respectively. A processing time is set to, for example, 120 s. In the above description, as a process gas in the W selective CVD, a gas mixture of $WF_6$ and $SiH_4$ is used. However, in place of the gas mixture, a gas mixture of $WF_6$ and $H_2$ can also be used. Furthermore, a gas mixture of $WF_6$ and $SiH_4$ is used in the initial step of the W deposition, and a gas mixture of $WF_6$ and $H_2$ is used in the filling step. With this combination process, the opening 150 can also be entirely buried.

A growing direction of the W film 260 by the selective CVD method is one direction from the lower side to the upper side. When the W film 260 is grown from one direction, a crystal size of W can be made larger than that obtained when the W film 260 is grown from many directions as in the case in which the W film 260 is grown from the side wall of the opening 150 and the bottom surface of the opening 150. As a result, the resistance of the W film 260 can be more reduced. Therefore, the contact plug can be further reduced in resistance. In addition, by using the selective CVD method, W can be buried without any gap even though the opening 150 is deformed in a bowing shape without being straightly formed.

The embodiments have been described with reference to the concrete examples. However, the present invention is not limited to the concrete examples.

Although not described in the above, a Cu wire using Cu, a Cu—Sn alloy, a Cu—Ti alloy, a Cu—Al alloy, or the like can be formed to be connected to the W film serving as the contact plug in each of the embodiments described above. Furthermore, as the thickness and the number of layers of an interlevel dielectric, the sizes, the shapes, and the number of openings, and the like, values and shape necessary for a semiconductor integrated circuit or various semiconductor elements can be appropriately selected and used.

Furthermore, all semiconductor devices and all methods of manufacturing a semiconductor device which include the elements of the present invention and which can be appropriately changed in design by a person skilled in the art are included in the scope of the invention.

For the sake of descriptive convenience, methods generally used in the semiconductor industry, for example, a photolithography process, cleaning performed after and before the processing, and the like are omitted. However, the invention includes these methods as a matter of course.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for fabricating a semiconductor device comprising:
   forming a dielectric film on a semiconductor substrate;
   forming an opening in the dielectric film;
   forming a refractory metal film in the opening;
   performing a nitriding process to the refractory metal film;
   removing a nitride of the refractory metal film formed on a side wall of the opening; and
   depositing tungsten (W) in the opening from which the nitride is removed.

2. The method according to claim 1, wherein
   the nitride of the refractory metal film formed on the side wall of the opening is removed to leave a nitride of the refractory metal film on a bottom surface of the opening.

3. The method according to claim 2, wherein
   the W is selectively deposited on the nitride of the refractory metal film left.

4. The method according to claim 3, wherein
   the W is deposited upwardly from a lower side in one direction.

5. The method according to claim 1, wherein
   the nitride of the refractory metal film is removed by a wet etching process.

6. The method according to claim 1, wherein
   the refractory metal film is formed by a deposition method having directivity.

7. The method according to claim 1, wherein
   on a bottom portion of the opening in which the refractory metal film is formed, a portion of the refractory metal film on the semiconductor substrate surface is changed into a silicide film while leaving the refractory metal film on a surface portion of the refractory metal film.

8. The method according to claim 7, wherein
   the nitride of the refractory metal film is formed by nitriding the refractory metal film which is not changed into the silicide film.

9. The method according to claim 1, wherein
   as a material of the refractory metal film, titanium (Ti) is used.

10. The method according to claim 9, wherein
    the nitride of the refractory metal film is titanium nitride (TiN).

11. The method according to claim 9, wherein
    the refractory metal film is formed by performing a reducing process to titanium tetrachloride.

12. The method according to claim 1, wherein
    the W is formed by a chemical vapor deposition method which reduces tungsten hexafluoride.

13. The method according to claim 1, further comprising
    performing a soak process which exposes an inner wall of the opening to a reducing gas atmosphere after removing and before depositing the W.

* * * * *